United States Patent
Chao et al.

(10) Patent No.: US 7,129,419 B2
(45) Date of Patent: Oct. 31, 2006

(54) PRINTED CIRCUIT BOARD WITH LOW NOISE

(75) Inventors: Shih-Chieh Chao, Taipei (TW); Chih-Wen Huang, Taipei (TW); Chuh-Lin Liao, Taipei (TW)

(73) Assignee: Tatung Co., Ltd., Taipei (TW)

( * ) Notice: Subject to any disclaimer, the term of this patent is extended or adjusted under 35 U.S.C. 154(b) by 173 days.

(21) Appl. No.: 10/868,768

(22) Filed: Jun. 17, 2004

(65) Prior Publication Data
US 2005/0092520 A1 May 5, 2005

(30) Foreign Application Priority Data
Nov. 5, 2003 (TW) .............................. 92130953 A

(51) Int. Cl.
*H05K 1/16* (2006.01)

(52) U.S. Cl. .................. 174/260; 361/777; 333/12; 174/255

(58) Field of Classification Search ............... 174/255, 174/260, 261, 262; 361/792, 793, 794, 795, 361/816, 818; 333/243, 246
See application file for complete search history.

(56) References Cited

U.S. PATENT DOCUMENTS

| | | | | |
|---|---|---|---|---|
| 5,068,596 A | * | 11/1991 | Banura | 323/351 |
| 5,561,584 A | * | 10/1996 | Tang | 361/220 |
| 5,587,920 A | * | 12/1996 | Muyshondt et al. | 716/15 |
| 5,926,377 A | * | 7/1999 | Nakao et al. | 361/763 |

* cited by examiner

*Primary Examiner*—Ishwar Patel
(74) *Attorney, Agent, or Firm*—Bacon & Thomas, PLLC

(57) ABSTRACT

The present invention relates to a printed circuit board with low noise. A voltage source layer and a ground layer of the printed circuit board are divided into an analog area and a digital area respectively via an isolation line, and adapted to conduct voltage source signal and ground signal respectively. Because the isolation line is an open pattern and a capacitor adapts to position near the opening, the noise and the electro-magnetic parameter of the printed circuit board are reduced.

8 Claims, 3 Drawing Sheets

PRINTED CIRCUIT BOARD WITH LOW
NOISE

BACKGROUND OF THE INVENTION

1. Field of the Invention

The present invention relates to a printed circuit board and, more particularly, to a printed circuit board with low noise.

2. Description of the Related Art

As shown in FIG. 1, a printed circuit board 10 is composed of at least three circuit boards; one layer is a voltage source (power) layer, and another layer is a ground layer, the surface of which (either the top face or the bottom face) is used as a layout for signal lines (as a signal layer). At least one electronic component is placed on the top or the bottom layer of the printed circuit board 10 and its signal pins, voltage source pins, and ground pins are separately connected to other electronic components, the voltage source layer and the ground layer on the surface of the printed circuit board 10. The electronic components can be categorized into analog electronic components and digital electronic components based on their signal characteristics. Analog electronic components include audio chips, amplifiers, power supplies, etc.; digital electronic components include digital signal processors (DSP), microprocessors, image signal (video) drivers, etc. To prevent the noise generated on the voltage source layers from the digital electronic components affecting the voltage source layers for the analog electronic components, an isolation area 11 is provided on the voltage source layer of the printed circuit board 10. The region in the isolation area 11 is called an analog area A1, another region outside of the isolation area 11 is called a digital area A2. The analog area A1 and the digital area A2 have no electrical connection. Therefore, any noise generated on the voltage source layers from the digital electronic components cannot affect the voltage source lines for the analog electronic components, which reduces interference on the printed circuit board. In a similar manner the ground layer of the printed circuit board 10 can use the same structure, and so requires no further description.

However, when the digital electronic components and the analog electronic components need to transmit data to each other, the signal lines are of necessity crossed over the isolation area 11, and the resulting variety of voltage levels (meaning that the voltage levels are discontinuous with respect to the power and ground voltages) will affect the characteristics of signals. Furthermore, different signals can interfere with each other due to electro-magnetic coupling generated by the signal lines crossing the isolation area of the printed circuit board, and the electro-magnetic radiation may exceed a predetermined maximum.

Therefore, it is desirable to provide a printed circuit board with low noise to mitigate and/or obviate the aforementioned problems.

SUMMARY OF THE INVENTION

A main objective of the present invention is to provide a printed circuit board with low noise that can reduce noise within the printed circuit board.

Another objective of the present invention is to provide a printed circuit board with low noise that can reduce the electro-magnetic radiation generated by the printed circuit board.

In order to achieve the above-mentioned objectives, the low noise printed circuit board of the present invention has at least three circuit layers, and the printed circuit board comprises: at least one isolation line for dividing the circuit layers into at least one first area and at least one second area, the isolation line forming an opened pattern; and at least one capacitor placed on the printed circuit board and on one side of an opening of the opened pattern. Wherein the opened pattern is an open square, an open rectangle, an open circle, an open triangle, an open pentagon or an open hexagon.

Other objects, advantages, and novel features of the invention will become more apparent from the following detailed description when taken in conjunction with the accompanying drawings.

DETAILED DESCRIPTION OF THE PREFERRED EMBODIMENT

The printed circuit board with low noise in the present invention utilizes an isolation line to divide the printed circuit board into two areas: an analog area and a digital area. Since the digital area is not a closed area, the analog area and the digital area can be electrically connected and have the same voltage level. At least one capacitor is placed near the opening (only on one side or either sides of the opening) between the analog area and the digital area, and is utilized to remove noise by capacitive filtering effects. When the signal line running across the opening between the analog area and the digital area with identical power reference voltage level, the signal quality on the signal line will be maintained, and the electro-magnetic radiation of the printed circuit board can also be reduced.

Figure 1:
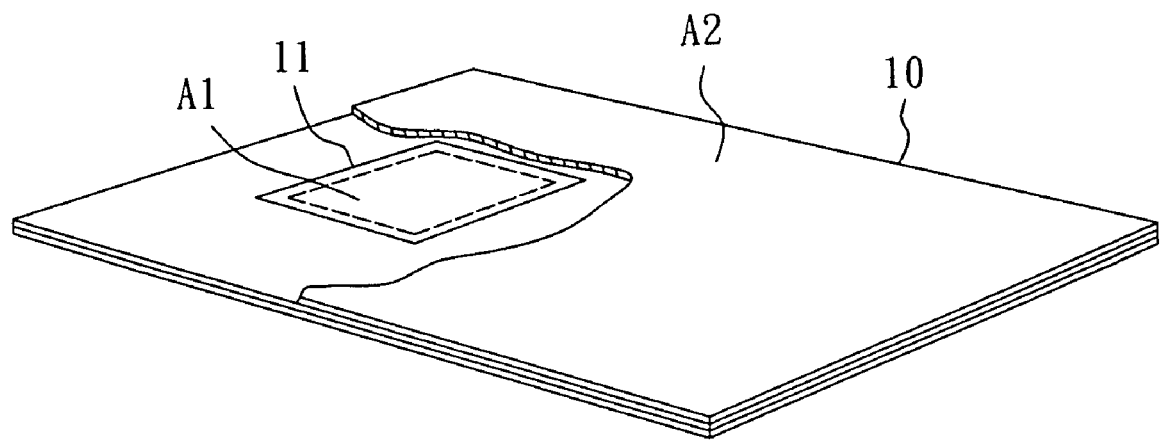
FIG. 1 is a schematic drawing of a prior art printed circuit board.
Figure 2:
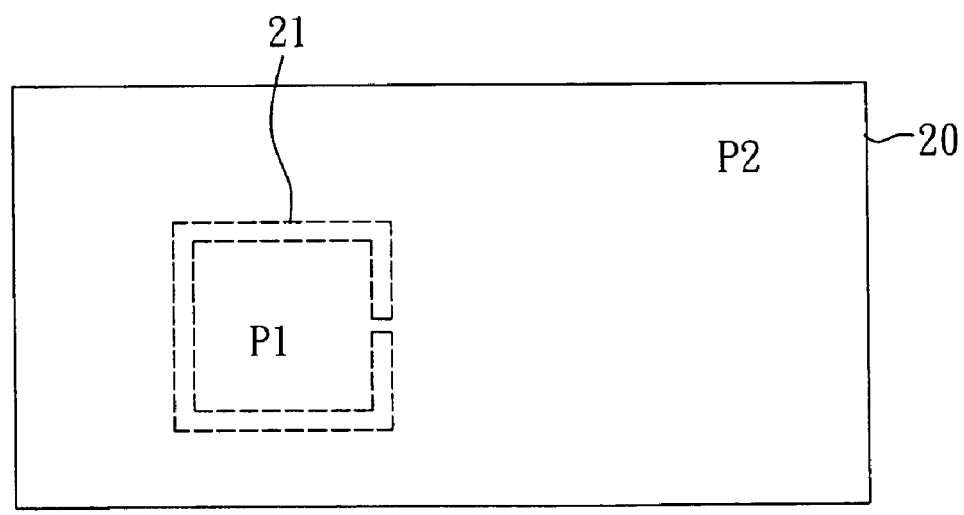
FIG. 2 is a schematic drawing of a printed circuit board with an isolation line according to the present invention.
Figure 3:
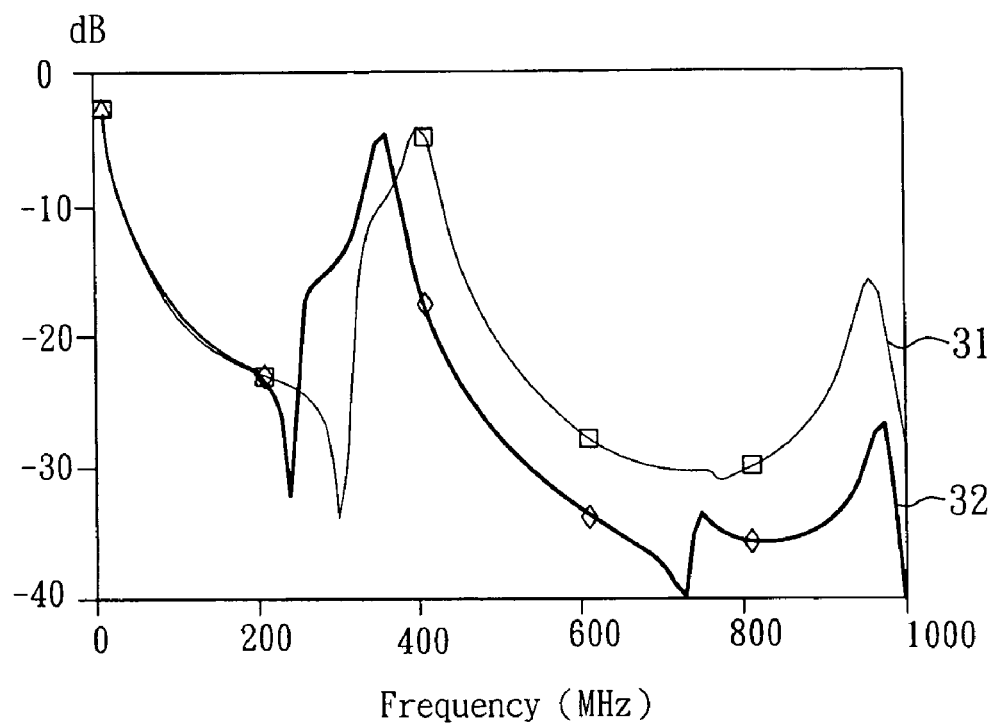
FIG. 3 is a graph of an electro-magnetic scattering parameter of the printed circuit board according to the present invention.

First, a printed circuit board (with dimensions of 74 mm×142 mm) without a capacitor of the present invention, and a printed circuit board 20 with at least one present invention capacitor are compared. As shown in FIG. 2, an isolation line 21 is used to divide the printed circuit board 20 into two areas: an analog area P1 and a digital area P2. The dimensions of the analog area P1 are assumed to be 40 mm×40 mm. Of course, the dimensions of the analog area P1 can be changed according to the needs of the user, such as 30 mm×30 mm, or 50 mm×50 mm. A measurement equipment is used to measure scattering parameters between the mark P1 and the mark P2 (for example, a distance of 90 mm). The larger the transmission coefficient of the scattering parameter is, the more the electro-magnetic wave can transmit between the analog area and the digital area, which indicates a poorer noise isolation capability. Please refer to FIG. 3. Line 31 shows the transmission coefficient of the scattering parameter of the printed circuit board without the capacitor. Since there is an opening between the analog area P1 and the digital area P2, the scattering parameter is close to 0 dB when the printed circuit board works in a low frequency or zero frequency state. Line 32 indicates the scattering parameter of the printed circuit board 20 with dimensions changed to 50 mm×50 mm. Accordingly, the larger the area of the analog area P1, the lower the resonant frequency (the frequency of a maximum of the transmission coefficient of the scattering parameter) of the printed circuit board 20. In other words, the printed circuit board 20 has a smaller scattering parameter at higher frequencies, and a larger electro-magnetic scattering parameter at lower frequencies. Since the user requires different working frequencies for different electronic components on the printed circuit board, the dimensions of the analog area P1 can be determined by the needs of the user. Moreover, the open shape formed by the isolation line 21 can be an open square, an open rectangle, an open circle, an open triangle, an open pentagon or an open hexagon.

Figure 4:
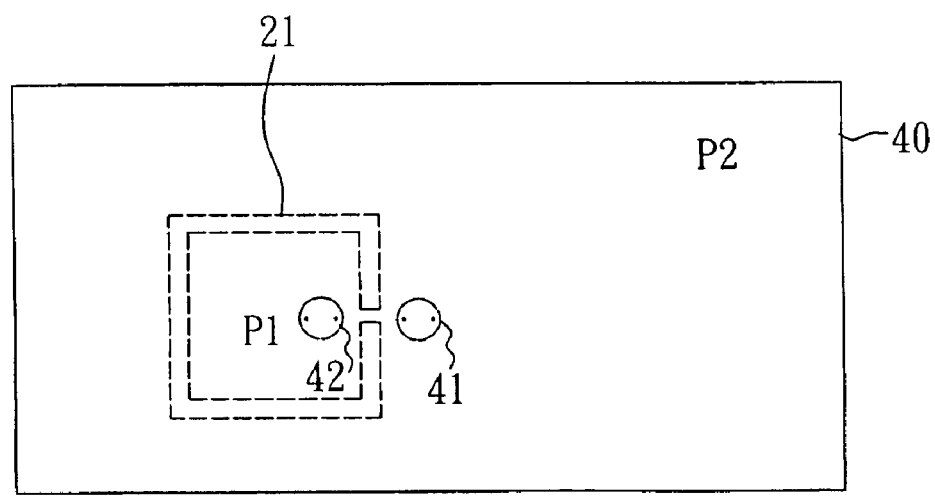
FIG. 4 is a schematic drawing of positions of a capacitor and an isolation line according to the present invention.
Figure 5:
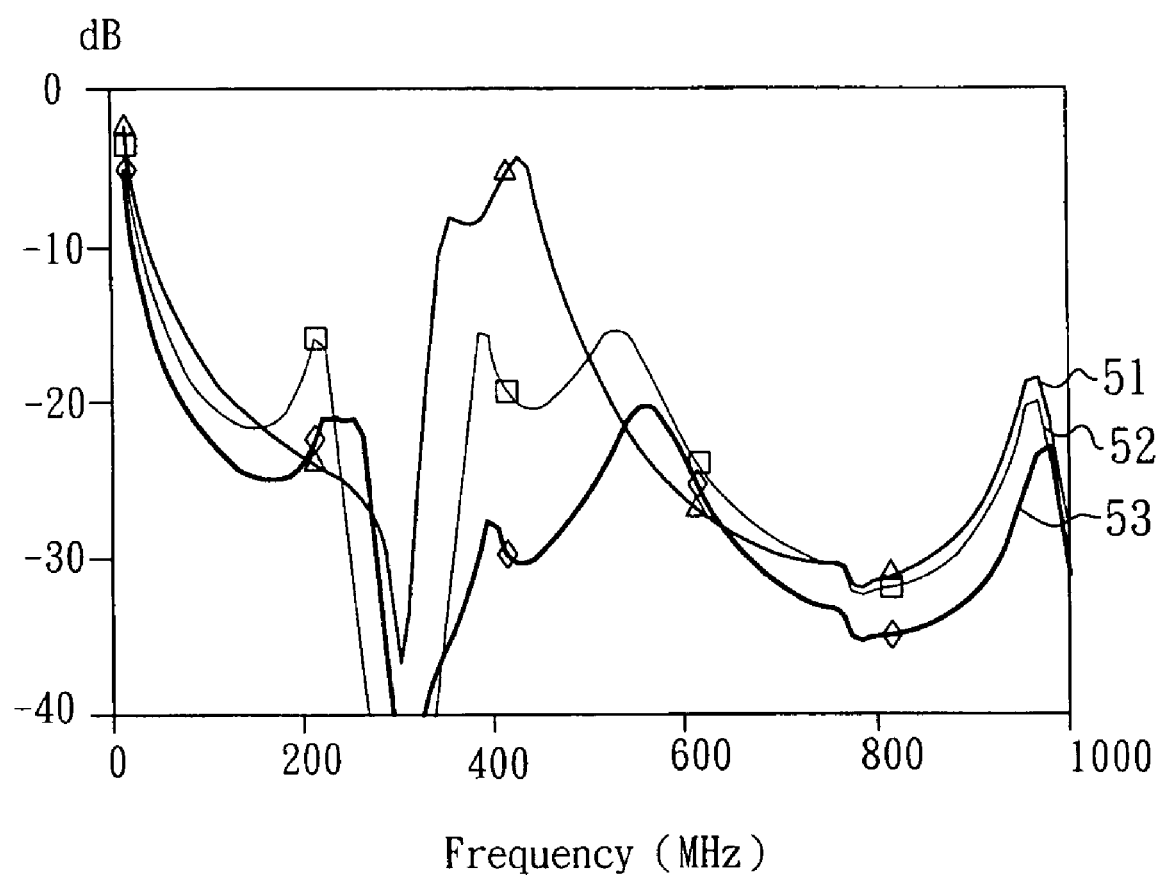
FIG. 5 is a graph of an electro-magnetic scattering parameter of a printed circuit board with a capacitor according to the present invention.

Please refer to FIG. 4. The two sides of the opening on the printed circuit board 20 shown in FIG. 2 are separated by 1.5 mm, and two capacitors 41, 42 are separately placed next to the two sides to form a printed circuit board 40 with low noise of the present invention. The capacitors 42, 41 are respectively placed in the analog area P1 and the digital area P2, and their capacitances are 300 pF and 100 pF. The positions of these two capacitors may be swapped regarding measurement or experience. Please refer to FIG. 5. FIG. 5 shows transmission coefficients S21 of the electro-magnetic scattering parameter under a working frequency of 30 MHz to 1000 MHz. Line 51 indicates the electro-magnetic scattering parameter of the printed circuit board 40 without any capacitors. Line 53 indicates the scattering parameter of the printed circuit board 40 having two capacitors, and shows a decrease of the scattering parameter. The user may also place only one capacitor (which has a capacitance of 170 pF) at the opening, and although this is not as efficient as two capacitors, it is still better than no capacitors at all. Without any capacitors, under a working frequency of 20 to 420 MHz, a maximum transmission coefficient S21 (which is −4.4 dB) of the scattering parameter is generated; when one capacitor is placed at the opening, a maximum transmission coefficient S21 of the scattering parameter is −15 dB; when two capacitors are placed at two sides of the opening, a maximum transmission coefficient S21 of the electro-magnetic scattering parameter is below −20 dB. Therefore, using either one or two capacitors can obviously reduce the transmission coefficient S21 of the scattering parameter. Similarly, the user can place more than two capacitors at one side of the opening to reduce the scattering parameter. The capacitance of the each capacitor may be between 1 pF and 0.1 μF.

Accordingly, the user can also divide the voltage source layer and the ground layer into the analog area and the digital area and place a capacitor on one side or two sides of the opening to satisfy the requirements of the user.

Since the scattering parameter is reduced, the low noise printed circuit board 40 of the present invention has better noise isolation effects, and noise from the analog area and the digital area will have less interference with each other. Furthermore, since the voltage level of the analog area and the digital area are the same, less electro-magnetic radiation is created.

Although the present invention has been explained in relation to its preferred embodiment, it is to be understood that many other possible modifications and variations can be made without departing from the spirit and scope of the invention as hereinafter claimed.

What is claimed is:

1. A low noise printed circuit board, having at least three circuit layers, the printed circuit board comprising:
    at least one isolation line for dividing the circuit layers into at least one first area and at least one second area, the isolation line forming an opened pattern; and
    at least one capacitor placed in said first area at one side of said opening and at least one capacitor placed in said second area at another side of said opening.

2. The printed circuit board as claimed in claim 1, wherein the opened pattern can be an open square.

3. The printed circuit board as claimed in claim 1, wherein the capacitance of the at least one capacitor is between 1 picofarad and 0.1 microfarads.

4. The printed circuit board as claimed in claim 1, wherein the at least one first area is an analog area and the at least one second area is a digital area.

5. The printed circuit board as claimed in claim 1, wherein the at least three circuit layers are a power layer, a ground layer and a signal layer respectively.

6. The printed circuit board as claimed in claim 5, wherein the at least one isolation line is placed on the voltage source layer.

7. The printed circuit board as claimed in claim 5, wherein the at least one isolation line is placed on the ground layer.

8. The printed circuit board as claimed in claim 5, wherein the at least one isolation line is placed on the power layer and the ground layer separately.

* * * * *